(12) United States Patent
Huott et al.

(10) Patent No.: US 7,257,745 B2
(45) Date of Patent: Aug. 14, 2007

(54) ARRAY SELF REPAIR USING BUILT-IN SELF TEST TECHNIQUES

(75) Inventors: William V. Huott, Holmes, NY (US); Franco Motika, Hopewell Junction, NY (US); Pradip Patel, Poughkeepsie, NY (US); Daniel Rodko, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 262 days.

(21) Appl. No.: 11/047,419

(22) Filed: Jan. 31, 2005

(65) Prior Publication Data

US 2006/0174175 A1 Aug. 3, 2006

(51) Int. Cl.
G11C 29/00 (2006.01)
G01R 31/28 (2006.01)
G11C 17/18 (2006.01)

(52) U.S. Cl. ............... 714/710; 714/733; 714/726; 714/718; 365/201; 365/225.7

(58) Field of Classification Search .............. None
See application file for complete search history.

(56) References Cited

U.S. PATENT DOCUMENTS

| | | | | |
|---|---|---|---|---|
| 3,783,254 A | * | 1/1974 | Eichelberger | 708/100 |
| 3,784,907 A | * | 1/1974 | Eichelberger | 324/617 |
| 3,961,252 A | * | 6/1976 | Eichelberger | 714/720 |
| 4,513,418 A | * | 4/1985 | Bardell et al. | 714/726 |
| 5,313,424 A | * | 5/1994 | Adams et al. | 365/200 |
| 5,659,551 A | * | 8/1997 | Huott et al. | 714/725 |
| 5,805,789 A | * | 9/1998 | Huott et al. | 714/7 |
| 5,920,515 A | | 7/1999 | Shaik et al. | 365/200 |
| 5,987,632 A | | 11/1999 | Irrinki et al. | 714/711 |
| 6,181,614 B1 | * | 1/2001 | Aipperspach et al. | 365/200 |
| 6,367,042 B1 | | 4/2002 | Phan et al. | 714/733 |
| 6,397,313 B1 | * | 5/2002 | Kasa et al. | 711/168 |
| 6,424,926 B1 | * | 7/2002 | Mak | 702/117 |
| 6,453,436 B1 | * | 9/2002 | Rizzolo et al. | 714/726 |
| 6,490,702 B1 | * | 12/2002 | Song et al. | 714/726 |
| 6,496,429 B2 | * | 12/2002 | Murai et al. | 365/200 |
| 6,651,202 B1 | | 11/2003 | Phan | 714/733 |

\* cited by examiner

*Primary Examiner*—Phung My Chung
(74) *Attorney, Agent, or Firm*—Lynn L. Augspurger

(57) ABSTRACT

A soft-fust test algorithm is distributed on-chip from an ABSIT engine through an LSSD shift register chain to dynamically evaluate a plurality of arrays with redundancy compensation for bad elements and repair those that are fixable. Using single-bit MISR error evaluation an ABSIT test sequence is executed concurrently on all arrays through the shift register chain. If any arrays are in error, redundancy compensation is employed and the ABIST test is repeated for all possible array redundant combinations until a functional configuration for each array is identified or all possible redundant combinations have been tried. Once functioning array configurations are verified, the associated soft-fuse states can be used to blow fuses and/or extracted for further system setup, permanent fuse-blowing and yield analysis. Multiple shift register chains driven by separate ABIST engines may be required to test all arrays on a chip.

14 Claims, 4 Drawing Sheets

ARRAY SELF REPAIR USING BUILT-IN SELF TEST TECHNIQUES

RELATED APPLICATIONS

U.S. patent application Ser. No. 10/721,646, filed Nov. 25, 2003 and entitled "System and Method for Testing Electronic Devices on a Microchip" is hereby incorporated by reference.

FIELD OF THE INVENTION

The present invention relates to testing of arrays embedded in complex logic circuits embodied in large scale integration (LSI) and very large scale integration (VLSI) circuit devices and more particularly, to the diagnosing and repair of such arrays.

BACKGROUND OF THE INVENTION

The density of very large scale integration (VLSI) devices, incorporating complex functions operating at extreme circuit performances, has driven designers to integrate many diverse memory array macros within these devices. These memory macros range from large cache arrays occupying relatively large portions of the chip's real estate, to a multitude of small arrays used as register stacks, trace arrays, content addressable memories (CAMs), and many other special purpose functions. These highly integrated circuit functions in conjunction with state-of-the-art semiconductor technology advances usually result in relatively low device yields unless redundancy compensation is an integral part of the overall design. This is especially the case for array macros where the dense design of the memory cell has critical yield impacts.

Currently, VLSI devices incorporate structure to perform on-chip test functions. These built-in test and diagnostic functions are based on several Design for Test (DFT) techniques using scan chains testing techniques, such as Level Sensitive Scan Design (LSSD) and associated Logic & Array Built-in-self-test (LBIST & ABIST) devices, on-product-clock-generation (OPCG) techniques, and others. Many of the BIST designs are further based on Signature Analysis (SA) concepts as a response data compression method. As described by E. B. Eichelberger and T. W. Williams in an article entitled "A Logic Design Structure for LSI Testability" on pages 462-468 of the Proceedings of the 14th Design Automation Conf., LSSD rules impose a clocked structure on logic circuit memory elements such as latches and registers and require these memory elements be tied together to form a shift register scan path so that they are accessible for use as test input and output points. Therefore, test input signals can be introduced or test results observed wherever one of the memory elements occurs in the logic circuit. Being able to enter the logic circuit at any memory element for introducing test signals or observing test results, allows the combinational and sequential logic to be treated as much simpler combinational logic for testing purposes thus considerably simplifying test generation and analysis. Patents describing LSSD and built-in self test techniques include U.S. Pat. No. 3,783,254; No. 3,784,907; No. 3,961,252; No. 4,513,418; No. 6,181,614; No. 5,805,789; and No. 5,659,551. The subject matter of these patents and the above described Eichelberger and Williams article are hereby included by reference.

The problem addressed herein is encountered in the testing and determination of redundancy configurations for large numbers of small array macros in this ABIST and signature analysis design environment. Although the problem could be solved by a tedious and inefficient method of interactively testing each of the small arrays individually, this would result in excessive test time and complex test software support algorithms. Another approach may be to add logic support functions to each array to enable redundancy determination, but this would also result in the excessive chip real estate consumption overhead.

BRIEF DESCRIPTION OF THE INVENTION

In accordance with the present invention, a soft-fuse test algorithm is distributed on-chip from an ABIST engine through an LSSD shift register chain to dynamically evaluate a plurality of arrays having redundant elements and repair those arrays that are fixable by substitution of the redundant elements for the bad elements. With this algorithm the arrays outputs are monitored by a different multiple input signature register (MISRs) loaded with initial data pattern seeds so that a test run fills a seeded MISR with a signature of either all "0"s or all "1"s when the array is good. This permits a simple "single-bit" MISR error evaluation of the array. Using this single-bit MISR error evaluation technique, an ABIST test sequence is executed concurrently on all arrays. If any arrays are in error, redundant element substitution is employed and the ABIST test sequence is repeated until a functional configuration for each array is identified or all possible redundant combinations have been tried. Once functioning array configurations are verified, the associated soft-fuse states can be used to permanently set electronic or e-fuses or can be extracted for further system setup, permanent laser fuse-blowing and/or yield analysis. Multiple shift register chains driven by separate ABIST engines may be required to test all arrays on a chip.

Therefore, it is an object of the present invention to provide improved testing methods for use in testing of arrays.

A further object of the invention is to provide rapid memory array diagnosis and repair in the VLSI devices.

Another object of the invention is to locate bad array bits in multiple memory arrays and substitute redundant bit positions using LSSD or other similar scan design techniques.

BRIEF DESCRIPTION OF THE DRAWINGS

These and other objects of the invention are best understood by reading the following description of various embodiments of the invention while making reference the accompanying figures of which.

DETAILED DESCRIPTION OF THE EMBODIMENTS

Figure 1:
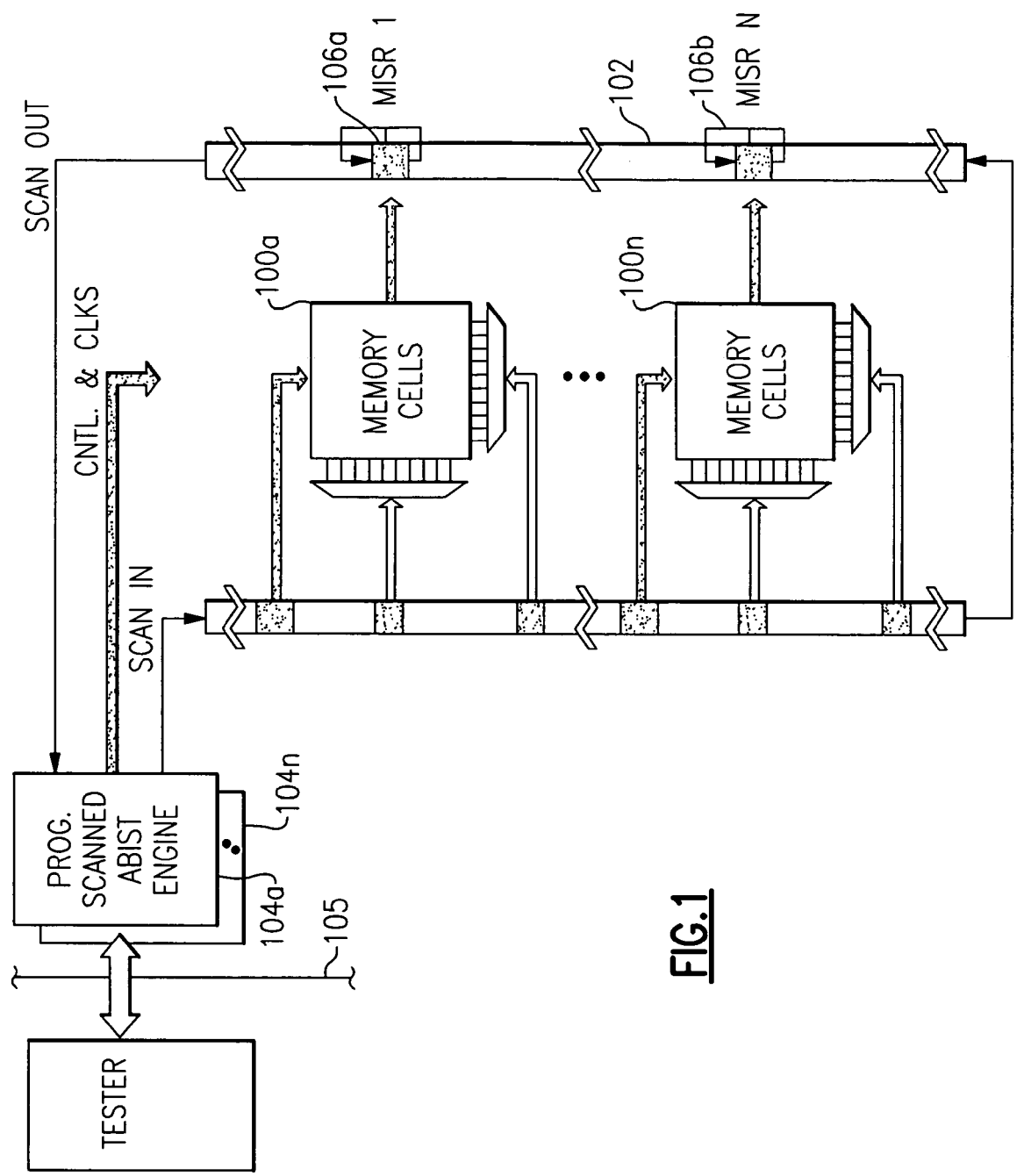
FIG. 1 is a schematic diagram of multiple arrays arranged in a scanned ABIST configuration using a separate response compress latch register of MISR.

Reference will now be made to embodiments of the invention shown in the accompanying drawings. Where possible, the same reference numerals are used throughout the drawings to refer to the same or like parts.

A typical Scanned ABIST configuration is depicted in FIG. 1. In this example, a number of arrays 100a to 100n are embedded within an integrated circuit design and accessed via a scan chain 102. On-chip ABIST engines 104a to 104n contain hard wired array test data (address, data, controls and clock signals) for all arrays 100. An off-chip tester 103 sets up the ABIST engine for testing, selects the test to be performed by the ABIST engines 104 and receives test results from the engines. The output responses for the arrays 100 are compressed into individual MISRs 106a to 106n which are also accessible via the scan chain 102. The ABIST engine 104a generates test patterns for testing the arrays 100 and seeds for the MISRs that result in the MISRs 106 of all good arrays containing a pattern of all either "0" or "1"s upon completion of the test. (The seeding of MISR's to obtain the all "0"s or all "1"s patterns upon completion of the testing of good arrays is described in the above identified copending patent application entitled "System and Method for Testing Electronic Devices and Microchip.) A pattern of other than all "0"s or all "1"s in such a seeded MISR would indicate that the array monitored by that MISR has failed the test and is defective. The outputs of all the MISRs are transmitted back to ABIST engine 104a by the scan path 102 to provide information for the ABIST engine to control progression of the testing. This ABIST scan chain array configuration can be replicated multiple times on a chip 105 for different sets of arrays. A separate BIST engine 104a to 104n is provided for each such configuration of arrays.

Figure 2:
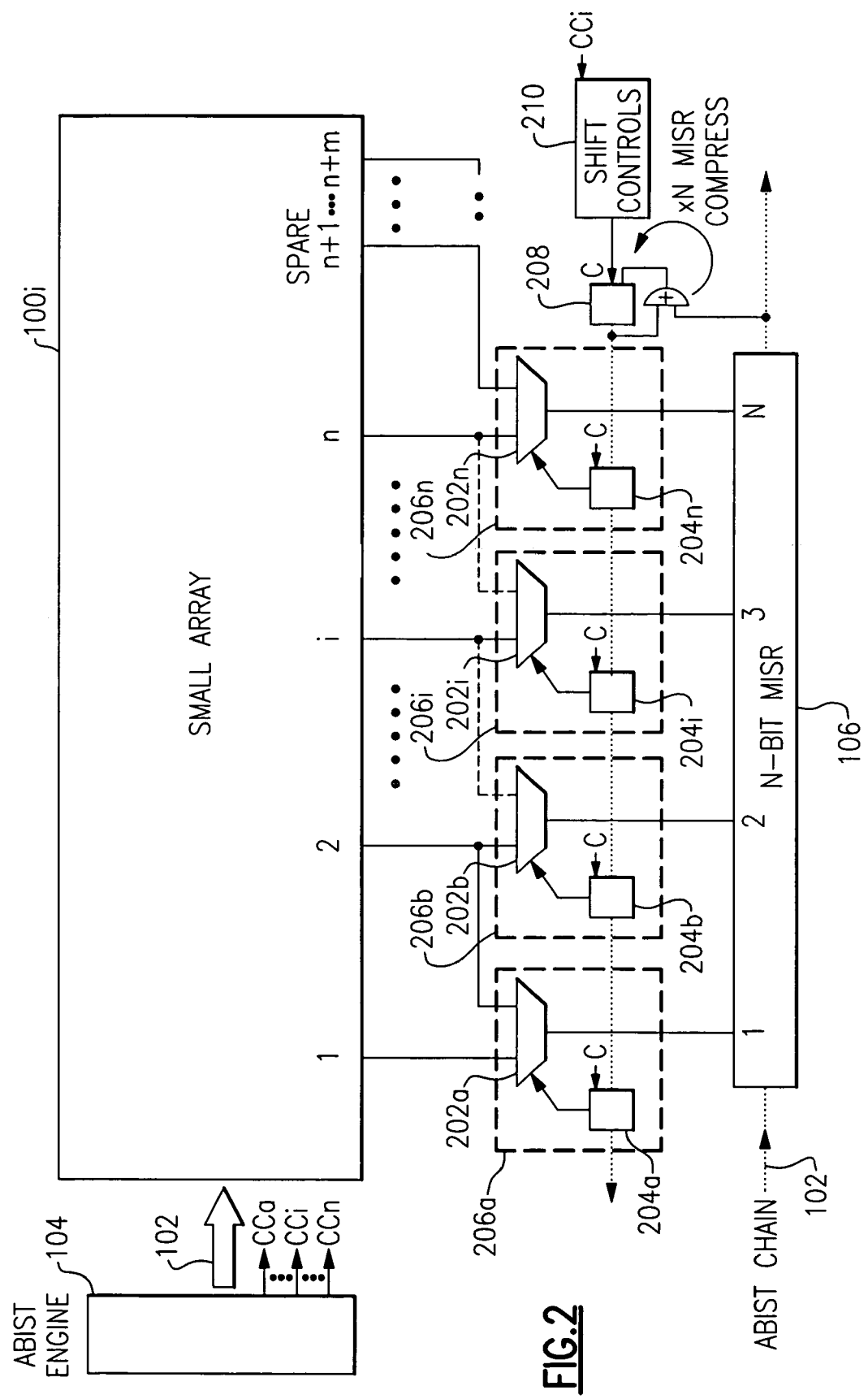
FIG. 2 is a schematic of an array in the ABIST arrangement of FIG. 1 with a soft fuse chain for spare bit line substitution.

As shown in FIG. 2, each small array 100 of FIG. 1 has at least one additional spare bit-line (N+1st bit-line) that can be configured to replace a single failing bit-line. Logic blocks 202 and latches 204 control transfer of data from the bit lines 1 to N+1 of the array 100 to bit positions 1 to N of the MISR 106. If there is a "0" stored in the latch 204 of any of the soft fuses 206, the bit line associated with that latch 206 is connected directly to the like numbered MISR bit position. However, if there is a "1" in the latch 204l the soft fuse 206 via the multiplexer 204 selects the next higher ordered bit line. After completion of a test run, the contents of the latches 204 are controlled by latch 208 which receives and stores the output of the last stage of the MISR 106. If at any time during the shifting of the contents out of the MISR the last stage of the MISR contains a "1", that "1" is stored in latch 208 and subsequently the contents shifted into the latch 204n of the soft-fuse scan chain for the array. Thus, after any test if any bit in the MISR is a "1" (i.e. an error), a "1" bit is shifted into the soft-fuse chain. Progression of "1" bits down the latches is controlled by the ABIST engine 104a through shift controls 210. The ABIST engine provides a unique clock signal $C_{ca}$ to $C_{cn}$ to each array. If after any test sequence the MISR 106 stores a "1", the ABIST provides a clock signal $C_{c1}$ to the shift controls to advance the bit from latch 208 and any higher order latches 204 into the next lower order latch. If the MISR output to the ABIST indicates the array is good, the ABIST does not provide the clock signal $C_{c1}$ to the particular array to progress the "1" bits along the soft-fuse chain thereby freezing the contents of the soft-fuse chain latches 204. Between tests, the soft-fuses 206 retain their state at the end of the previous test sequence. At the end of all the tests, the soft-fuse chain data are unloaded into the ABIST and the appropriate redundancy configuration determined from the retained information.

Figure 3:
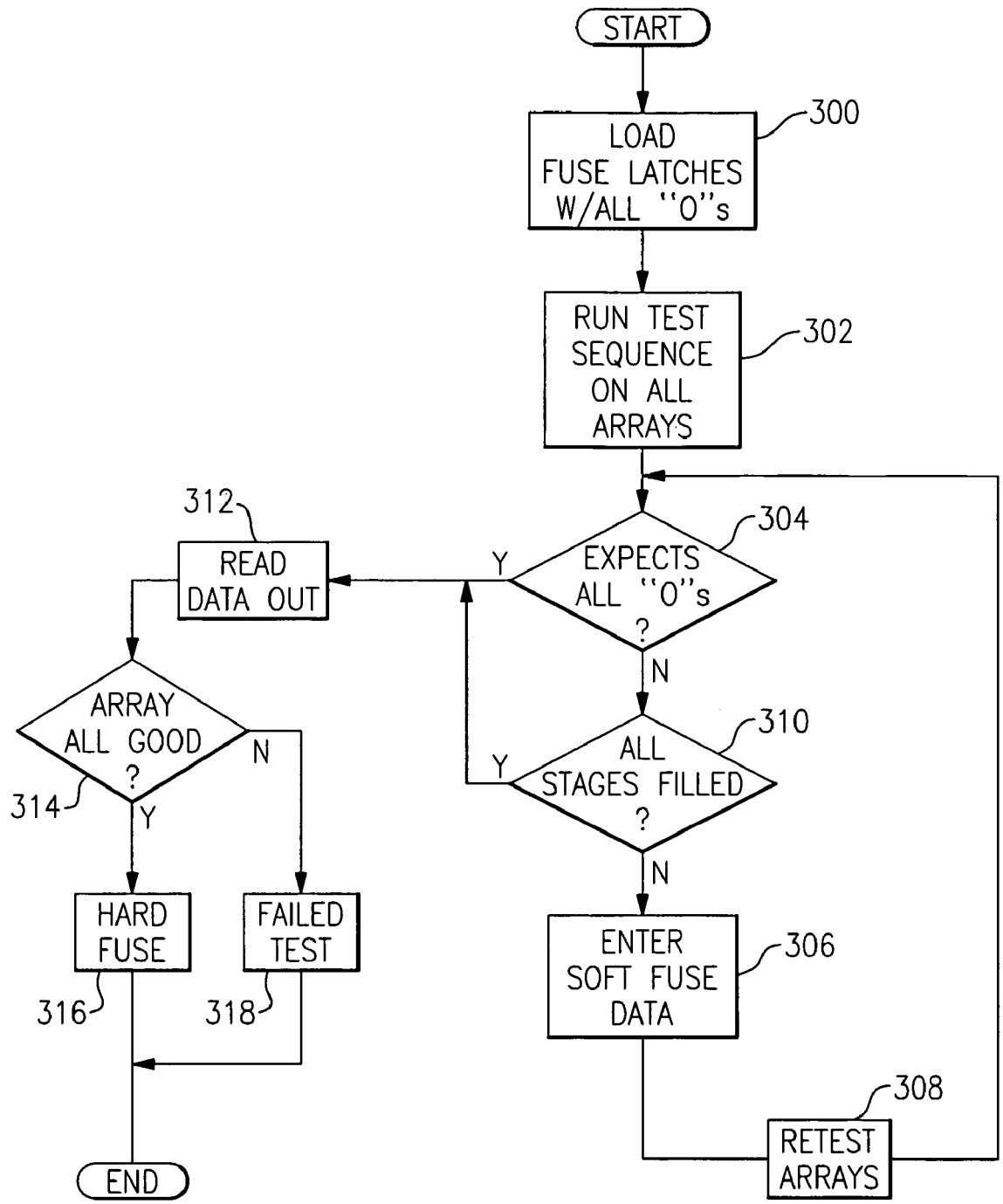
FIG. 3 is a flow diagram of a method of diagnosing the arrangement of FIG. 2 using the present invention.

As shown in FIG. 3:

1. Prior to testing, the array data in all soft-fuse latches 206 serving all arrays are set to "0", selecting bit-lines 1-to-N (step 300). Also, the test patterns and pretest MISR seeds for all arrays are loaded into the scan path 102 to obtain the desired output pattern from each of the good arrays (here all "0"s). Each of the arrays has a signature output (usually of mixed "1"s and "0"s) that indicates that the array is good. As pointed out above, the seed is introduced into the MISR so that the MISR is filled with all "0"s or all "1"s when the good signature output is produced by the arrays at the end of a test run.

2. The test is then run for on all arrays 100a to 100n (step 302). If the test fails in any of the arrays (step 304) a pattern other than all "0"s is stored in the MISR of those arrays. The content of all MISRs is shifted out causing a "1" to be stored in latch 208. The soft latch chain is then stepped causing a single "1" to be shifted into latch 204 of the soft-fuse chain in each of the failing arrays (step 306) deselecting bit line N and selecting bit-lines 1-to-(N−1) and (N+1) of those failed arrays.

3. With the "1" bit in latch 204n of the failed arrays, all or only the failing arrays are retested (step 308). If the test fails again in any of the failing arrays, another "1" is shifted into the fuse-chain of the failing arrays deselecting bit line N−1 and selecting bit-lines 1-to-(N−2) and N-to-(N+1).

4. Step three is repeated until a passing test for all the arrays of the chip is detected in step 304 or until the latches 204a to 204n all store "1"s as indicated by step 310 (in other words, all the bit-lines have been substituted). At this point, the e-fuses can be permanently blown or data is read out (step 312). If array tests are good (step 314), the "1"s can be burned in or fused into the chip (step 316). Failure of an array after filling all the latches 304 with "1"s indicates that one or more of the arrays cannot be corrected with the one spare bit line and the chip is declared unfixable (step 318) with one redundant output line. However, the described redundancy configuration techniques can be extended to the use of multiple spare bit liens and could be extended to replace bad word lines to save an array. Also there are other redundancy reconfiguration design techniques that could be used with the proposed method described in this disclosure.

As can be seen, FIG. 2 depicts a "gated soft-fuse shift" technique and associated algorithm for "freezing" the repair configuration after a "good" test has been detected. This technique uses two basic concepts. The first concept is to employ the above described signature analysis method to generate a "single bit fail" from the MISR signature. The second concept is to use this "single bit fail" for shifting the data along soft-fuse chain of the arrays to correct the arrays. As shown, once all the tests for all the arrays have been completed, the contents of the soft-fuse register can be unloaded for further analysis and/or can be permanently burned into the logic circuits 202 using known fusing circuitry 406, shown in FIG. 4, with either electronic or laser fusing.

Figure 4:
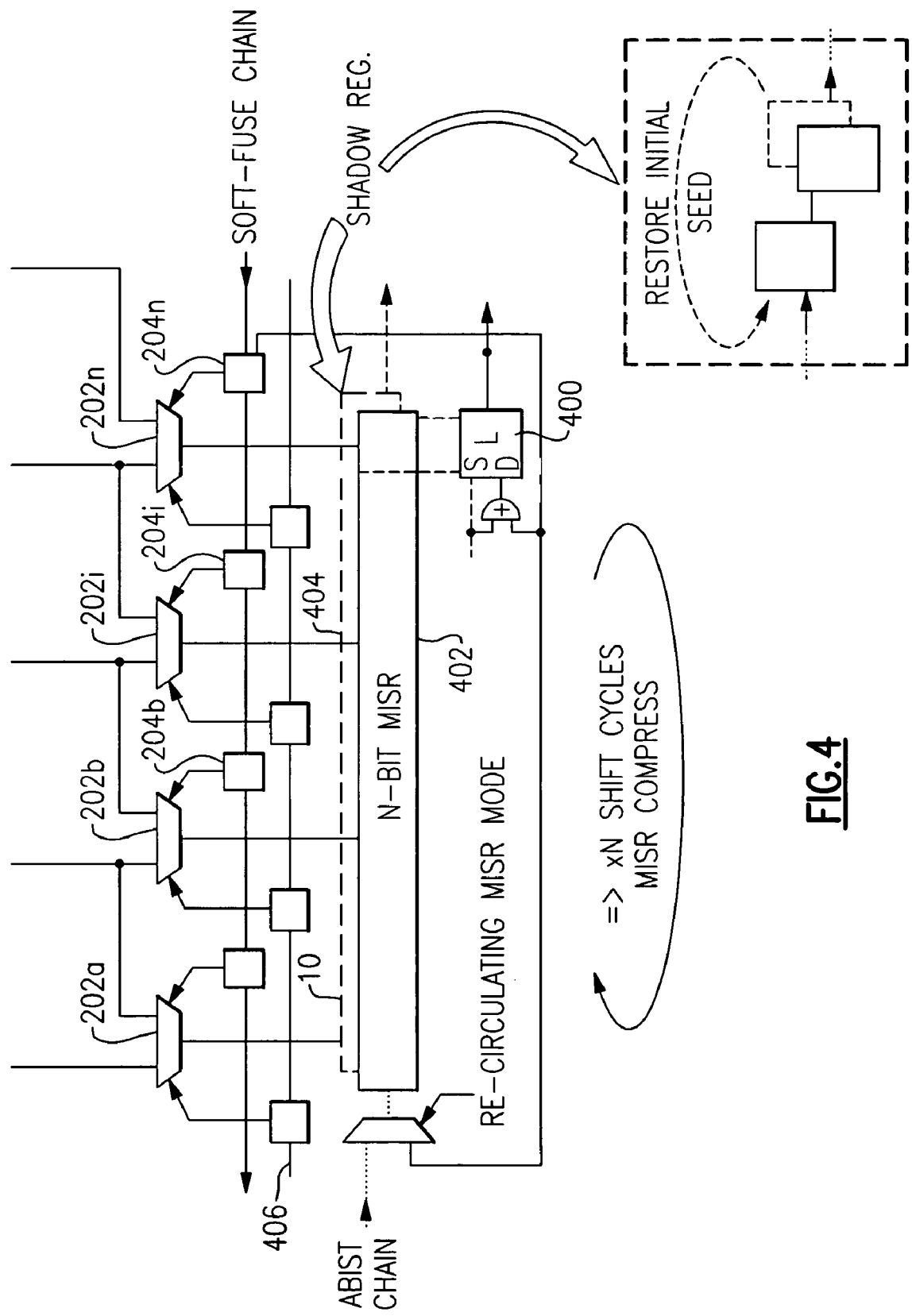
FIG. 4 is a schematic of the ABIST arrangement of FIG. 2 with a "single bit" compress latch in the MISR chain and a shadow register.

FIG. 2 illustrates one configuration to generate a single-bit error from the MISR contents. If any bit in the MISR is a "1", the "stick-bit" latch 208 (which is a latch that retains a set state until reset) will be set to "1" indicating a fail. As shown in FIG. 4, the stick-bit latch could be the last latch 400 within a recirculating MISR 402. This concept is independent of the MISR length as long as a sufficient number of shift cycles is performed for shifting the data out of the longest MISR involved in the test.

The convergent MISR signature analysis concept depends on reloading the MISR initial seed prior to each test pass. This can be accomplished in several ways. One approach is to reload the seeds to all the MISRs prior to each test pass from an external source via the ABIST scan chain 102. Another approach may be to have the ABIST engine 104 load the MISR seed through the array macros. A third preferred embodiment would be to use a MISR with an associated "shadow" register, as shown in FIG. 4. In this case, the initial seed(s) for all the MISRs is loaded into shadow register stages and then using the shadow register contents to load the MISR stages prior to each test. This could be used in cases where it is inconvenient to "broadside load" the MISR to the pre-seeded state from the shadow register, or where scanning the MISR to the pre-seeded state from the shadow register is not an option. Since the application of an ABIST test generally does not involve much of the non-array logic on the chip, finding spare latches that can be used as shadow registers is relatively easy. Almost any latch on the chip that does not participate in the act of ABIST testing can potentially be used as part of the shadow register.

The above concept can also be fully used with multiple MISRs with scan paths of any length and arrays of varying sizes and number of redundant output lines. Following are some of the benefits and advantages of the proposed concept that can be used from basic wafer test to a fully configured system test:

1. Single-bit pass/fail signature analysis.
2. Extendible to multiple MISR structures.
3. Supports parallel and concurrent soft-fuse redundancy.
4. Could be easily extended to permanent fuse-flow.
5. Compatible with existing scan designs, BIST and Signature Analysis techniques.
6. Eliminates need to compare MISR signature.
7. Simplifies soft-fuse results acquisition and analysis.
8. MISR initial seed can be reloaded from a MISR "shadow" register, the ABIST engine or from an external source.
9. Simplifies array macro yield analysis and diagnostics.

The foregoing discussion discloses and describes exemplary embodiments of the present invention. One skilled in the art will readily recognize from such discussion, and from the accompanying drawings and claims, that various changes, modification and variations can be made therein. For instance, the invention has been described in terms of particular scan chain and shift register configurations. Therefore it should be understood that the present invention is not limited to those embodiments but all embodiments within the spirit and scope of the invention, as defined in the following claims.

What is claimed is:

1. A method for testing multiple memory arrays that include redundant output lines and are incorporated into integrated circuits comprising:
   a) arranging shift register latches in a scan path providing inputs to the arrays and receiving outputs from the arrays;
   b) shifting data through the scan path to load the shift register latches with a first data pattern for generating a single bit output for each of the arrays indicating whether one or more of the output lines of the arrays are bad;
   c) replacing one of the output lines in any of the arrays indicating a faulty output line with a redundant output line;
   d) retesting the arrays using the scan path to see if the output for any of the arrays still indicate at least one bad output line;
   e) repeating steps b) to d) until all arrays are good or any bad array cannot be corrected by step c).

2. The method of claim 1 wherein, there is one redundant output line that is repositioned to locate a bad output line in any array.

3. The method of claim 2 wherein, there are a plurality of scan lines separately testing multiple arrays in steps a) through d).

4. The method of claim 2 wherein, including the step of hard wiring the output lines after completion of steps a) through d).

5. A logic system chip having a plurality of memory arrays with redundant memory output lines comprising:
   a) an array built in on chip test system for testing said arrays;
   b) a scan path linking the multiple arrays to an ABIST generator so that the ABIST generator can provide input signals to each of the arrays and receive output signals from the arrays;
   c) a MISR output for each of the arrays arranged in the scan path for the receipt of the output signals from the arrays;
   d) a plurality of gate lines linking the outputs of the arrays to the MISR; and
   e) soft fuse output line substitution system responsive to the MISR output for switching the connections of the outputs of the array to the MISR to enable substitution of a redundant output line for any of the output lines.

6. The semiconductor chip of claim 5 wherein, the soft fuse system includes a string of gate circuits one of the gate circuits connected to two adjacent output lines of the array for switching between the two output lines of the array in response to a data bit shifted down the string of gate circuits.

7. The semiconductor chip of claim 6 wherein, the MISR is coupled to the string of gate circuits for controlling the progression of the data bit down the gate circuits.

8. A semiconductor logic system chip of claim 5 including code in the ABIST for testing the multiple memory arrays that include redundant output lines comprising:
   a) code for shifting data through the scan path to load the shift register latches with a first data pattern for generating a single bit output for each of the arrays indicating whether one or more of the output lines of the arrays are bad;
   b) code for replacing one of the output lines in any of the arrays indicating a faulty output line with a redundant output line;
   c) code for retesting the arrays using the scan path to see if the output for any of the arrays still indicate at least one bad output line; and
   d) code for repeating steps a) to c) until all arrays are good or any bad array cannot be corrected by step b).

9. The semiconductor logic chip of claim 8 wherein, there is at least one redundant output line that is repositioned to locate a bad output line in an array.

10. The semiconductor logic chip of claim 8 including code to preseed the MISR to obtain a single bit error indication.

11. The semiconductor logic chip of claim 5 wherein, there are a plurality of scan lines separately testing multiple arrays in steps a) through d).

12. The semiconductor logic chip of claim 5 including hard wiring the output lines after completion of steps a) through d).

13. The semiconductor logic chip of claim 12 wherein, the soft fuse system includes a string of gate circuits one of the gate circuits connected to two adjacent output lines of the array for switching between the two output lines of the array in response to a data bit shifted down the string of gate circuits.

14. The semiconductor logic chip of claim 13 wherein, the MISR is coupled to the string of gate circuits for controlling the progression of the data bit down the gate circuits.

* * * * *